United States Patent [19]

Enyo et al.

[11] Patent Number: 4,996,134
[45] Date of Patent: Feb. 26, 1991

[54] CONJUGATED DIENE COPOLYMER, A PROCESS FOR PRODUCING THE COPOLYMER, AND A PHOTOSENSITIVE COMPOSITION COMPRISING THE COPOLYMER

[75] Inventors: Hiroji Enyo, Suzuka; Shin-ichiro Iwanaga; Yasuhiko Takemura, both of Yokkaichi, all of Japan

[73] Assignee: Japan Synthetic Rubber Co., Ltd., Tokyo, Japan

[21] Appl. No.: 716,206

[22] Filed: Mar. 26, 1985

[30] Foreign Application Priority Data

Apr. 13, 1984 [JP] Japan .................. 59-74546
Oct. 17, 1984 [JP] Japan .................. 59-216367

[51] Int. Cl.$^5$ .................. C08F 265/02; C08F 265/06; C08F 265/08; C08F 2/50
[52] U.S. Cl. .................. 430/286; 522/37; 522/40; 522/43; 522/48; 522/116; 522/117; 522/121; 522/125; 430/287; 526/318.43
[58] Field of Search .................. 526/283, 318.43; 522/121; 430/286, 287

[56] References Cited

U.S. PATENT DOCUMENTS

| | | | |
|---|---|---|---|
| 3,642,486 | 2/1972 | Burness | 430/543 |
| 3,775,518 | 11/1973 | Endo | 525/76 |
| 4,125,675 | 11/1978 | Sekiguchi | 428/523 |
| 4,141,868 | 2/1979 | Emmons et al. | 526/283 |
| 4,163,763 | 8/1979 | Tsuchiya et al. | 526/283 |
| 4,199,619 | 4/1980 | Oda et al. | 427/151 |
| 4,265,946 | 5/1981 | Yabe | 430/531 |
| 4,275,142 | 6/1981 | Hosaka et al. | 430/286 |
| 4,304,850 | 12/1981 | Koyama | 428/519 |
| 4,360,628 | 11/1982 | Runavot | 526/283 |
| 4,423,089 | 12/1983 | Sekiya | 427/171 |
| 4,426,504 | 1/1984 | Nandi | 526/283 |

Primary Examiner—Marion E. McCamish
Assistant Examiner—Arthur H. Koeckert
Attorney, Agent, or Firm—Oblon, Spivak, McClelland, Maier & Neustadt

[57] ABSTRACT

A conjugated diene copolymer comprising (A) 10 to 60 mole % of a conjugated diene compound unit, (B) 5 to 50 mole % of an α,β-ethylenically unsaturated carboxylic acid unit, (C) 0.1 to 20 mole % of a polyfunctional alkenyl compound unit, (D) 0 to 10 mole % of a diene compound unit having cyclic carbon-carbon double bonds and (E) 0 to 80 mole % of a monoolefinically unsaturated compound unit, the sum of the amounts of units (A), (B), (C), (D) and (E) being 100 mole %, said copolymer having an intrinsic viscosity [η] of 0.01 to 3.0 dl/g as measured at 30° C. in dimethylformamide. The copolymer is soluble in aqueous alkali solutions, excels in processability and photosetting property, and has excellent rubber elasticity and transparency even after photosetting. Accordingly, a photosensitive composition comprising the copolymer, a photopolymerizable unsaturated monomer and a photosensitizer can greatly improve the complicated process for the production of conventional rubber relief plates of flexographic printing, and shorten the production time.

26 Claims, 1 Drawing Sheet

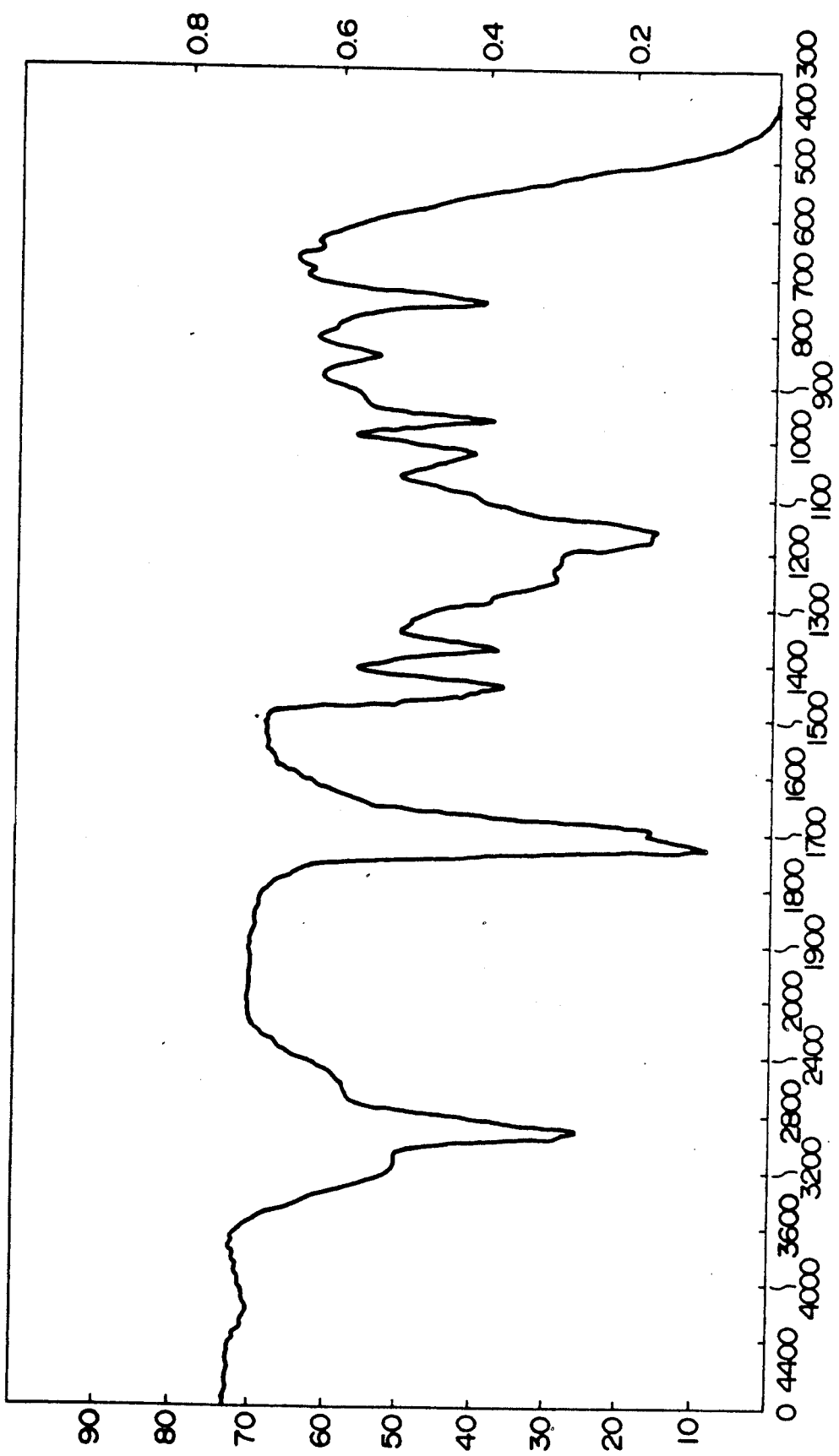

CONJUGATED DIENE COPOLYMER, A PROCESS FOR PRODUCING THE COPOLYMER, AND A PHOTOSENSITIVE COMPOSITION COMPRISING THE COPOLYMER

BACKGROUND OF THE INVENTION

1. Field of the Invention

This invention relates to a conjugated diene copolymer, a process for producing the copolymer, and a photosensitive composition comprising the copolymer.

2. Discussion of the Background

Synthetic resins have hitherto been used as vehicles for coatings and inks or as adhesives. However, when the coating surface and the adhering surface are flexible, ordinary synthetic resins are unsuitable for applying to the surface, and it is necessary to use a resin having a rubber elasticity, namely, a rubber. Hence, ordinary acrylic rubbers and diene rubbers are used in the form of a solution in an organic solvent because they are inherently insoluble in water and also insoluble in aqueous alkali or acid solutions.

Many organic solvents are harmful to the human body and are inflammable. Therefore, if the organic solvents could be replaced by an aqueous solvent, it would be very advantageous from an aspect of a safety.

As resins soluble in aqueous solvents, carboxyl group-containing polymers are known. However, these polymers have been inferior in rubber elasticity as well as in transparency required for paints, for vehicles of inks and for adhesives.

As a component for a photosensitive composition for use in photoresists, there is proposed a conjugated diene copolymer soluble in aqueous alkali solutions (Japanese Patent Publication No. 1,140/83, U.S. Pat. No. 4,275,142). This copolymer is insufficient in transparency and further requires an improvement in rubber elasticity. Furthermore, the copolymer is insufficient also in photosetting property.

Recently, there has been proposed a photosensitive resin composition comprising (I) a copolymer comprising (A) a conjugated diolefin (diene) hydrocarbon, (B) an α,β-ethylenically unsaturated carboxylic acid, and optionally (C) a monoolefinically unsaturated compound, (II) a photopolymerizable unsaturated monomer and (III) a photosensitizer (Japanese Patent Publication No. 29,849/84, U.S. Pat. No. 4,275,142). However, it has been found that this photosensitive resin composition has various advantages but is not satisfactory in transparency and processability.

SUMMARY OF THE INVENTION

Accordingly, an object of this invention is to provide a conjugated diene copolymer which is soluble in aqueous alkali solutions, excels in processability and photosetting property, retains excellent rubber elasticity and transparency even after photosetting and has excellent water resistance.

Another object of this invention is to provide a process for producing the above-mentioned copolymer.

Still another object of this invention is to provide a photosensitive composition comprising the copolymer.

According to this invention, there is provided a conjugated diene copolymer comprising (A) 10 to 60 mole % of a conjugated diene compound unit, (B) 5 to 50 mole % of an α,β-ethylenically unsaturated carboxylic acid unit, (C) 0.1 to 20 mole % of a polyfunctional alkenyl compound unit, (D) 0 to 10 mole % of a diene compound unit having cyclic carbon-carbon double bonds and (E) 0 to 80 mole % of a monoethylenically unsaturated compound unit, the sum of the amounts of units (A), (B), (C), (D) and (E) being 100 mole %, said copolymer having an intrinsic viscosity $[\eta]$ of 0.01 to 3.0 dl/g as measured at 30° C. in dimethylformamide.

BRIEF DESCRIPTION OF THE FIGURE

Other objects and advantages of this invention will become apparent from the following description and the accompanying FIGURE, which shows an infrared absorption spectrum of a copolymer according to this invention produced in Example 1, which appears hereinafter.

DETAILED DESCRIPTION OF THE PREFERRED EMBODIMENTS

This invention further provides a process for producing the above-mentioned copolymer which comprises polymerizing a mixture of (A) 5 to 50% by weight of a conjugated diene compound, (B) 5 to 30% by weight of an α,β-ethylenically unsaturated carboxylic acid, (C) 0.5 to 20% by weight of a polyfunctional alkenyl compound, (D) 0 to 20% by weight of a diene compound having cyclic carbon-carbon double bonds and 0 to 60% by weight of a monoolefinically unsaturated compound, the sum of the amounts of (A), (B), (C), (D) and (E) being 100% by weight, in an aqueous medium with a radical polymerization catalyst.

This invention still further provides a photosensitive composition comprising (I) the above-mentioned copolymer, (II) a photopolymerizable unsaturated monomer and (III) a photosensitizer.

The conjugated diene compound which is the monomer unit (A) of the copolymer of this invention includes 1,3-butadiene, isoprene, chloroprene, 1,3-pentadiene, etc.

When the content of the unit (A) in the copolymer is less than 10 mole %, the copolymer is poor in rubber elasticity. When the content of the unit (A) exceeds 60 mole %, the photosensitive composition of this invention is poor in retainability of solid form and in processability. The content of the unit (A) in the copolymer is preferably 15 to 40 mole %, more preferably 20 to 40 mole %.

The α,β-ethylenically unsaturated carboxylic acid which is the monomer unit (B) of the copolymer of this invention includes acrylic acid, methacrylic acid, maleic acid, fumaric acid, monoethyl maleate, itaconic acid, etc. When the content of the unit (B) is less than 5 mole %, the copolymer is poor in solubility in aqueous alkali solutions. When the content of the unit (B) exceeds 50 mole %, the copolymer is poor in rubber elasticity. The content of the unit (B) is preferably 5 to 30 mole %, more preferably 10 to 20 mole %.

The polyfunctional alkenyl compound which is the monomer unit (C) of the copolymer of this invention is a compound having at least two vinyl linkages in the molecule, the reactivities of which are equivalent, and it includes, for example, poly(meth)acrylates such as ethylene glycol dimethacrylate, ethylene glycol diacrylate, trimethylolpropane trimethacrylate, propylene glycol dimethacrylate, propylene glycol diacrylate and the like; divinylbenzene; and trivinylbenzene. When the content of the unit (C) is less than 0.1 mole %, the copolymer is poor in transparency and processability. When the content of the unit (C) exceeds 20 mole %, the copolymer is poor in solubility in aqueous alkali solutions. The content of the unit (C) is preferably 0.1 to 10 mole %, more preferably 0.1 to 5 mole %.

The diene compound having cyclic carbon-carbon double bonds which is the monomer unit (D) of the copolymer of this invention includes dicyclopentenyl acrylate,

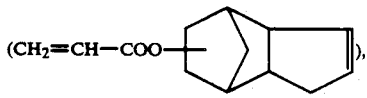

dicyclopentenyl methacrylate, dicyclopentenoxyethyl acrylate

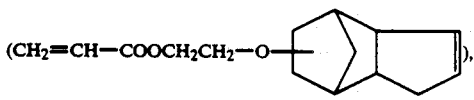

dicyclopentadiene, ethylidenenorbornene, vinylnorbornene, etc. The unit (D) is preferably dicyclopentenyl acrylate or dicyclopentenoxyethyl acrylate. When the content of the unit (D) exceeds 10 mole %, the copolymer is poor in solubility in aqueous alkali solutions. The content of the unit (D) is preferably 0.5 to 10 mole %, more preferably 1 to 5 mole %.

The monoolefinically unsaturated compound which is the monomer unit (E) of the copolymer of this invention includes acrylates and methacrylates such as ethyl acrylate and methacrylate, n-butyl acrylate and methacrylate, $\alpha$-ethylhexyl acrylate and methacrylate, n-octyl acrylate and methacrylate, dodecyl acrylate and methacrylate, methoxyethyl acrylate and methacrylate, ethoxyethyl acrylate and methacrylate, butoxyethyl acrylate and methacrylate, cyanoethyl acrylate and methacrylate, hydroxyethyl acrylate and methacrylate, hydroxypropyl acrylate and methacrylate, and the like; styrene; acrylonitrile; vinyl chloride; etc. These compounds can be used alone or in admixture depending upon the application purpose.

In order for the copolymer of this invention to retain the effects of the other components, the content of the unit (E) is at most 80 mole %, preferably 20 to 60 mole %, more preferably 30 to 50 mole %.

When the content of the unit (E) is less than 20 mole %, the contents of the unit (A) and the unit (B) become relatively large. The retainability of the solid form of the copolymer becomes bad when the contents of both unit (A) and unit (B) are too high, and the rubber elasticity of the copolymer becomes inferior when the content of the unit (B) is too high. The content of the unit (E) is most preferably 30 to 40 mole %.

The copolymer of this invention has an intrinsic viscosity [$\eta$] of 0.01 to 3.0 dl/g, preferably 0.1 to 2.0 dl/g, as measured at 30° C. in dimethylformamide. When the viscosity is less than 0.01 dl/g, it is difficult for the copolymer to keep the solid form, and hence, the handling of the copolymer is difficult. When the viscosity exceeds 3.0 dl/g, the copolymer is poor in processability.

Such a copolymer can be produced by radical-polymerizing in an aqueous medium a mixture consisting of (A) 5 to 50% by weight of a conjugated diene compound, (B) 5 to 30% by weight of an $\alpha,\beta$-ethylenically unsaturated carboxylic acid, (C) 0.5 to 20% by weight of a polyfunctional alkenyl compound, (D) 0 to 20% by weight of a diene compound having cyclic carbon-carbon double bonds and (E) 0 to 60% by weight of a monoolefinically unsaturated compound, the sum of the amounts of (A), (B), (C), (D) and (E) being 100% by weight. A molecular weight modifier is used for the control of the molecular weight of the copolymer. The amount of the molecular weight modifier used is 0.1 to 5 g per 100 g of the monomers. Each monomer and polymerization chemicals such as a radical initiator and the like may be added at one time before the start of polymerization, or in desired portions after the start of polymerization. The polymerization is conducted in a reactor freed of oxygen at 0° to 50° C. Operational conditions such as temperature, stirring and the like can be changed as desired in the course of polymerization. The polymerization can be conducted continuously or batchwise.

As the radical polymerization initiator, there can be used, for example, organic peroxides such as benzoyl peroxide, cumene hydroperoxide, p-menthane hydroperoxide, lauroyl peroxide and the like; diazo compounds such as azobisisobutyronitrile and the like; inorganic compounds such as potassium persulfate and the like; and redox catalysts such as an organic compound/iron sulfate mixture and the like. As the molecular weight modifier, there may be used t-dodecylmercaptan, dialkylxanthogen disulfide, etc.

The copolymer of this invention can be used as vehicles of a photosetting, water or oil paint or ink which can be applied even on flexible surfaces, or as photosetting adhesives applicable even on flexible surfaces. The copolymer can further be used as a toner material for copying and also as a material for photosensitive resins.

In the photosensitive composition of this invention, the residual double bonds resulting from the conjugated diene compound in the copolymer cause three-dimensional crosslinking by the action of an actinic ray such as an ultraviolet ray or the like, whereby the composition becomes insoluble in solvents. It has been found that when the composition further contains a photopolymerizable unsaturated monomer having at least one ethylenically unsaturated group in the molecule, the abovementioned crosslinking reaction is accelerated and this greatly improves the mechanical strength of a printing plate or the like produced from the composition.

The photopolymerizable unsaturated monomer (II) used in the photosensitive composition of this invention includes unsaturated aromatic compounds such as styrene, $\alpha$-methylstyrene, m-methylstyrene, p-methylstyrene, p-methoxystyrene, diisopropenylbenzene, divinylbenzene and the like; unsaturated nitrile compounds such as acrylonitrile, methacrylonitrile and the like; alkyl acrylates and methacrylates such as methyl (meth)acrylate, ethyl (meth)acrylate, propyl (meth)acrylate, n-butyl (meth)-acrylate, isobutyl (meth)acrylate, t-butyl (meth)acrylate, n-pentyl (meth)acrylate, n-hexyl (meth)acrylate, 2-ethylhexyl (meth)acrylate, n-octyl (meth)acrylate, n-decyl (meth)acrylate, lauryl (meth)acrylate, and the like; hydroxyalkyl acrylates and methacrylates such as 2-hydroxyethyl (meth)acrylate, 2-hydroxypropyl (meth)acrylate and the like; acrylates and methacrylates of alkoxyalkylene glycols such as methoxyethylene glycol, methoxypropylene glycol and the like; $\alpha,\beta$-ethylenically unsaturated carboxylic acids such as maleic acid, fumaric acid, fumaric anhydride, crotonic acid, itaconic acid, itaconic anhydride, citraconic acid, mesaconic acid and the like; monoesters of unsaturated polycarboxylic acids such as monoethyl maleate, monoethyl fumarate, monoethyl itaconate and the like; diesters such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate, dioctyl itaconate and the like; acrylamides and methacrylamide, such as acrylamide, methacrylamide, N,N'-methylenebisacrylamide, N,N'-hexamethylanebisacrylamide and the like; ethylene glycol diacrylate and dimethacrylate; diacrylates and dimethacrylates of polyalkylene glycols (the number of alkylene glycol units: 2 to 23); and diacrylates, triacrylates, tetraacrylates, dimethacrylates, trimethacrylates, tetramethacrylates and oligoacrylates of polyalcohols such as glycerine, pentaerythritol, trimethylolalkanes and tetramethylolalkanes (alkanes: methane, ethane and propane).

The photopolymerizable monomer (II) is used in an amount of 5 to 200 parts by weight, preferably 10 to 100 parts by weight, per 100 parts by weight of the copolymer (I). The photopolymerizable monomer (II) may be used in admixture of two or more if the total amount falls within the above range.

When the proportion of the photopolymerizable monomer (II) is less than 5 parts by weight, neither sufficient photosetting of the photosensitive resin layer nor sufficient improvement of the mechanical strengths of a printing plate can be expected. When the proportion exceeds 200 parts by weight, the rubber elasticity of the copolymer (I) is strikingly impaired and a reduction of the solvent resistance of the copolymer (I) results.

The photosensitizer (III) used in the photosensitive composition of this invention includes ordinary photoreaction initiators such as α-diketone compounds (e.g. diacetyl, benzil and the like), acyloins (e.g. benzoin, pivaloin), acyloin ethers (e.g. benzoin methyl ether, benzoin ethyl ether, benzoin propyl ether) and polynuclear quinones (anthraquinone, 1,4-naphthoquinone). The photosensitizer (III) is added in an amount of 0.1 to 10 parts by weight, preferably 1 to 5 parts by weight, per 100 parts by weight of the copolymer (I).

When the amount of the photosensitizer (III) added is less than 0.1 part by weight, it is impossible to sufficiently cure. When the amount exceeds 10 parts by weight, not all the photosensitizer added takes part in reaction, and hence, it is uneconomical, and in some cases, the photosensitizer (III) has poor compatibility with the copolymer (I) or the photopolymerizable monomer (II), resulting in a non-uniform dispersion.

Commercial products of the above-mentioned photopolymerizable unsaturated monomer (II) ordinarily contain a small amount of a thermal polymerization inhibitor such as p-methoxyphenol or the like. This inhibitor exerts no influence on the light exposure of the photosensitive composition and rather acts as a storage stabilizer for the photosensitive composition. Therefore, in production of the photosensitive composition, the commercial photopolymerizable unsaturated monomers as such can be added without removing the thermal polymerization inhibitor contained therein.

If necessary, there may further be added to the photosensitive composition a storage stabilizer such as hydroxyaromatic compounds, for example, hydroquinone, p-methoxyphenol, p-t-butylcatechol, 2,6-di-t-butyl-p-cresol, pyrogallol and the like; quinones, for example, benzoquinone, p-toluquinone, p-xyloquinone, and the like; and amines, for example, phenol-u-naphthylamine and the like, in an amount of 0.01 to 2 parts by weight per 100 parts by weight of the copolymer (I).

The photosensitive composition of this invention comprising (I) a copolymer, (II) a photopolymerizable unsaturated monomer, and (III) a photosensitizer can be produced as follows: A process which comprises adding, to a solution containing the copolymer (I) as produced by polymerization, appropriate amounts of a photopolymerizable unsaturated monomer (II) and a photosensitizer (III), thoroughly stirring the resulting mixture to obtain a uniform solution, and thereafter removing the solvent while warming the solution under reduced pressure; and a process which comprises previously removing the solvent from the above-mentioned copolymer solution under reduced pressure to obtain a highly viscous material or a solid material, and adding, to the material, a photopolymerizable unsaturated monomer (II) and a photosensitizer (III) with warming and stirring. The photosensitive composition thus produced has a liquid form or a rubbery solid form. The composition can, therefore, be formed into a photosensitive composition layer of a desired thickness by using a spacer of an appropriate thickness, by coating on a substrate by means of a roll coater or the like, or by compression or extrusion molding, after which the photosensitive composition layer can be exposed to light through a negative film and developed to produce a photosensitive resin relief printing plate. The photosensitive composition is high in rubber elasticity and best suited for use in flexographic printing plate. As the substrate for the photosensitive composition layer, there can be used a substrate having about the same rubber elasticity as the photosensitive composition. For example, there can be used a natural rubber sheet, a styrene-butadiene rubber sheet, a butadiene rubber sheet, an acrylonitrile-butadiene rubber sheet, an isoprene rubber sheet, an ethylene-propylene rubber sheet, a crystalline 1,2-butadiene resin sheet and a soft vinyl chloride resin sheet. When the use of a substrate having a low rubber elasticity is permitted, there can also be used a polyester film, a polypropylene film, a polystyrene film, a nylon film, a polyvinylidene chloride film, a polyethylene film and the like. When the photosensitive composition of this invention is used in fields such as newspaper printing, ordinary commercial printing and the like, there can be used, as the substrate, grained plates of aluminum, iron, magnesium and the like.

One of the characteristics of this invention is the developability with a dilute aqueous alkali solution. In this case, the alkali may be a conventional one and includes, for example, sodium hydroxide, potassium hydroxide, lithium hydroxide, ammonia, lithium carbonate, etc. An aqueous solution containing the same at such a low concentration as about 0.1 to 1.0% by weight can be used as a developing solution. As a matter of course, the photosensitive composition of this invention can be developed with not only an aqueous alkali solution but also an organic solvent such as an alcohol, a ketone, an aromatic hydrocarbon or the like.

The photosensitive composition of this invention requires only a short time for light exposure because of its high photosensitivity and can be developed in 1 to 2 min with a dilute aqueous alkali solution because of its very high solubility in the dilute aqueous alkali solution. The photoset and developed composition can be used for printing immediately after the drying, and hence, the photosensitive composition of this invention can substantially improve the conventional complicated process and the time for producing rubber relief plates for flexographic printing.

In the flexographic printing using a rubber relief plate made from the photosensitive composition of this invention, a solvent type flexographic ink can be used, of course. Since the photosensitive composition of this invention has good water resistance in spite of its high solubility in an aqueous alkali solution, there can also be used an aqueous flexographic ink in the midst of gradual shift from solvent type flexographic inks to aqueous type flexographic inks from the standpoint of air pollution prevention.

The photosensitive composition of this invention not only provides a resin relief plate for flexographic printing, but can also widely be utilized as a photosensitive material in various fields such as relief plates for newspaper printing and ordinary commercial printing, name plates, printed circuit boards, displays and photoadhesives. Besides, the photosensitive composition can be used as photopolymerizable, water and oil paints which can be applied even to flexible surfaces, as vehicles for inks which can be applied even to the flexible surfaces and as adhesives which can be applied even to flexible surfaces.

In the photosensitive composition of this invention, each component has the following function and role.

When the conjugated diene compound (A) to constitute the copolymer (I) is incorporated into the copolymer by copolymerizion, unreacted double bonds are left in the main or side chain of the copolymer, and therefore, to the double bonds are added the radicals of the photopolymerizable unsaturated monomer (II), whereby the composition after the photo-reaction forms firmly a three-dimensional reticular structure and in addition, the water resistance and solvent resistance are increased. Further, the conjugated diene compound (A) incorporated into the copolymer imparts to the photosensitive composition, the flexibility namely rubber elasticity, which a flexographic printing plate must have.

The α,β-ethylenically unsaturated carboxylic acid (B) of the copolymer (I) increases the affinity of the photosensitive composition toward dilute aqueous alkali solutions, namely, meets the developability of the composition with an aqueous alkali solution.

The polyfunctional alkenyl compound (C) of the copolymer (I) improves the transparency and processability of the photosensitive composition.

The monoolefinically unsaturated compound (E) of the copolymer (I) improves the mechanical properties of printing plates produced from the photosensitive composition in rubber elasticity, strength, elongation, etc. The compound (E) further improves the properties of the printing surface of the printing plates such as ink acceptability, ink transferability, etc.

The photopolymerizable unsaturated monomer (II) constituting the photosensitive composition acts on the residual double bonds derived from the compound (A) as mentioned above to accelerate the crosslinking reaction in the photosensitive composition to greatly improve the mechanical strength of printing plates produced from the composition after the crosslinking reaction.

Lastly, the photosensitizer (III) serves to impart a sufficient curing to the photosensitive composition layer.

This invention is explained more specifically below referring to Examples and Comparative Examples, which are not by way of limitation but merely by way of illustration.

EXAMPLES 1 TO 3 AND COMPARATIVE EXAMPLES 1 TO 10

Using the following monomers and polymerization chemicals, polymerization was conducted at 30° C. in a 20-liter autoclave:

| | |
|---|---|
| Ethyl acrylate | 53 parts by weight |
| Methacrylic acid | 20 parts by weight |
| Butadiene | 20 parts by weight |
| Ethylene glycol dimethacrylate | 2 parts by weight |
| Dicyclopentenyl acrylate | 5 parts by weight |
| Water | 250 parts by weight |
| Sodium dodecylbenzene-sulfonate | 5 parts by weight |
| Potassium persulfate | 0.27 parts by weight |
| Tertiary dodecylmercaptan | 0.6 parts by weight |
| Cyanoethylated diethanolamine | 0.15 parts by weight |
| Potassium hydroxide | 0.1 parts by weight |

When the polymerization conversion reached 90%, 0.2 part by weight per 100 parts by weight of the monomers was added to terminate the polymerization. Then, the polymerization system was heated and the residual monomers were removed by steam distillation. Thereafter, the polymer was coagulated by addition of an aqueous calcium chloride solution. The resulting crumbs were water-washed and then dried at 50° C. under vacuum to obtain a polymer sample for evaluation. The composition of the polymer obtained was measured by the pyrolysis gas chromatography. The content of methacrylic acid was measured by dissolving the polymer in dioxane and subjecting the resulting solution to alkali titration. As a result, the polymer had the following composition: Ethyl acrylate/methacrylic acid/butadiene/ethylene glycol dimethacrylate/dicyclopentenyl acrylate=44/17/36.2/0.8/2 (mole %).

The Tg of the polymer was measured by DSC, to find it −35° C. The intrinsic viscosity [$\eta$] of the polymer as measured at 30° C. in dimethylformamide was 0.31 dl/g. The infrared absorption spectrum of the polymer when a NaCl plate was used is as shown in the accompanying drawing.

By changing the kinds and amounts of the monomers and using the same polymerization procedure, polymerization was repeated. The compositions and test results of the polymers obtained are shown in Table 1. The polymer composition values are shown in mole %.

As seen in Comparative Examples 1 and 2, too low a content of the conjugated diene compound (A) gives a copolymer of poor rubber elasticity.

As seen in Comparative Example 3, too low a content of the α,β-unsaturated carboxylic acid (B) gives a copolymer of poor solubility in aqueous alkali solutions. As seen in Comparative Example 4, too high a content of the acid (B) gives a copolymer of poor rubber elasticity.

As seen in Comparative Example 5, too low a content of the polyfunctional alkenyl compound (C) gives a copolymer having a poor transparency and processability. As in Comparative Example 6, too high a content of the compound (C) gives a copolymer having a poor solubility in aqueous alkali solutions and a poor rubber elasticity.

As in Comparative Example 7, too high a content of the diene compound (D) having cyclic carbon-carbon duble bonds gives a copolymer having a poor solubility in aqueous alkali solutions. As in Comparative Examples 8 and 9, a copolymer having too high or too low an intrinsic viscosity is poor in handling and processability. As in Comparative Example 10, too high a content of the conjugated diene compound (A) gives a copolymer of poor processability.

The solubilities in aqueous alkali solutions, rubber elasticities, transparencies, water resistances and processabilities of the copolymers produced were measured according to the following test methods:

(1) Solubility in aqueous alkali solution

About one gram of a polymer was weighed. Thereto was added 100 ml of a 1% (by weight) aqueous potassium hydroxide solution, and the mixture was stirred at room temperature for 24 hr. Then, the total volume was filtered through a 200 mesh wire net. The residue on the net was dried at 80° C. for 20 hr under vacuum. The insoluble matter content (%) of the polymer was expressed as $100 \times b/a$ (%) wherein a is the original weight (g) of the polymer and b is the weight (g) of the residue after drying. This insoluble matter was used as an index of the captioned item.

(2) Rubber elasticity

A polymer sample was pressed by fingers to qualitatively examine the impact resilience. Clear existence of the impact resilience is expressed as ⊙, slight existence as Δ, no existence as χ.

(3) Transparency

A sheet of 0.5 mm in thickness was produced. The transparency of this sheet was evaluated by a transmittance (%) measured by an infrared spectrometer when an infrared light of 370 mμ was applied to the sheet.

(4) Water resistance

A polymer sample was deaerated and formed into a sheet of 2 mm in thickness. The sheet was punched to obtain a square sample of 20 mm×20 mm. The square sample thus obtained was immersed in water at 50° C. for 24 hr. The volume expansion ΔV (%) after immersion was used as an index of water resistance.

(5) Processability

A polymer was wound around a hot roll at 80° to 120° C. If the polymer had a poor windability or was very sticky and difficult to process, the polymer was rated as χ. Also, when the unwound sheet showed a large shrinkage, the polymer was rated as χ. The polymer which had no problems in respect of windability, stickiness and shrinkage was rated as ○.

The polymer having a small molecular weight and being unable to hold a solid form and accordingly difficult to handle is also rated as χ.

As appreciated from Table 1, the copolymer of this invention easily dissoves in aqueous alkali solutions and is excellent in rubber elasticity, transparency, water resistance and processability. Further, the copolymer can be produced easily and at a high yield according to the process of this invention.

EXAMPLE 4

(Production and application of photosensitive composition.)

In a 500-ml, three-necked, separable flask were placed (a) 159.2 g of a 62.8% by weight methanolic solution of a copolymer of butadiene (38 mole %), ethyl acrylate (45 mole %), methacrylic acid (12 mole %), ethylene glycol dimethacrylate (0.8 mole %), and dihydrodicyclopentadienyl acrylate (4.2 mole %), (b) 40.0 g of nonaethylene glycol dimethacrylate as a photopolymerizable unsaturated monomer, (c) 2.0 g of benzoin isopropyl ether as a photosensitizer and (d) 0.1 g of hydroquinone as a storage stabilizer. The mixture was thoroughly stirred until it became a solution.

The separable flask containing the solution was immersed in a water bath controlled at about 40° C. The solvent methanol was removed from the solution with stirring under reduced pressure to obtain a viscous photosensitive composition.

5.0 g of the photosensitive composition was placed on a styrene-butadiene rubber sheet of 64 cm$^2$ in area and 1.0 mm in thickness, and a photosensitive composition layer of 1.0 mm in thickness was formed using an applicator having a gap of 1.0 mm.

A negative film having an optical density of 3.5 was placed above the upper surface of the composition layer while keeping the distance between the film and the composition layer 0.3 mm. Then, the composition layer was exposed to an ultraviolet light emitted from a 250 W ultra-high pressure mercury lamp installed at a location 60 cm above the composition layer for 60 sec through the negative film. On the photosensitive composition after the light exposure was sprayed a 0.5% by weight aqueous sodium hydroxide solution for 2 min to effect development, whereby all the unexposed portions of the photoset composition layer were completely dissolved and removed to obtain a resin relief printing plate with a good fidelity to the original image. The resin plate had a rubber elasticity, and the rubber hardness (Shore A hardness at 20° C.) was 60. Separately, the above produced photosensitive composition layer was exposed to the same ultraviolet light as above for 60 sec directly without using the negative film. The photoset composition layer was punched to obtain a disk of 3.5 cm in diameter. The disk was immersed in a 0.1% aqueous sodium carbonate solution controlled at 40° C. for 24 hr. The disk was taken out and its swelling was measured, to find it 1.5%.

The resin relief plate produced above was subjected to printing with a black letterpress ink, to obtain a printed matter with a good ink transferability.

EXAMPLES 5 TO 10 AND COMPARATIVE EXAMPLES 11 AND 12

In a 500-ml, three-necked, separable flask were placed (a) 159.2 g of a 62.8% by weight methanolic solution of a copolymer (the physical properties are shown in Table 2) of butadiene (38 mole %), ethyl acrylate (49.2 mole %), methacrylic acid (12 mole %), and ethylene glycol dimethacrylate (0.8 mole %); (b) 40.0 g of nonaethylene glycol dimethacrylate as a photopolymerizable unsaturated monomer; (c) 2.0 g of benzoin isopropyl ether as a photosensitizer and (d) 0.1 g of hydroquinone as a storage stabilizer. The mixture was thoroughly stirred until it became a solution. Then, the separable flask containing the solution was immersed in a water bath controlled at about 40° C., and the solvent methanol was removed from the solution while stirring the solution under reduced pressure, to produce a viscous photosensitive composition.

5.0 g of the photosensitive composition was placed on a styrene-butadiene rubber sheet of 64 cm$^2$ in area and 1.0 mm in thickness and a photosensitive composition layer of 1.0 mm in thickness was formed by the use of an applicator having a thickness of 1.0 mm. The photosensitive composition layer was kept in the solid form and had no difficulty in handling.

A negative film having an optical density of 3.5 was placed above the composition layer so that the distance between the film and the composition layer became 0.3 mm. Then, the composition layer was exposed to an ultraviolet light emitted from a 250 W ultra-high pressure mercury lamp installed at a location 60 cm above the composition layer for 60 sec through the film. On the photosensitive composition after the light exposure was sprayed a 0.5% by weight aqueous sodium hydroxide solution for 2 min to effect development, whereby all the unexposed portions of the photoset composition layer were completely dissolved and removed, thereby producing a resin relief printing plate with a good fidelity to the original image. The resin plate had a rubber elasticity and the rubber hardness (Shore A hardness at 20° C.) was 60. Separately, the above produced photosensitive composition layer was exposed to the same ultraviolet light as above for 60 sec directly without using the negative film. The photoset composition layer was punched to obtain a disk of 3.5 cm in diameter. The disk was immersed in a 0.1% by weight aqueous sodium carbonate solution controlled at 40° C. for 24 hr. The disk was taken out and the degree of swelling was measured to find it 1.5%. The resin relief printing plate was subjected to printing with a black letterpress ink, thereby obtaining a printed matter with a good ink transferability (Example 5).

In the similar manner, there were produced and evaluated other photosensitive compositions (Examples 6 to 10 and Comparative Examples 11 and 12). The results are shown in Table 2.

The physical properties such as solubility in aqueous alkali solution, transparency, processability and the like, of the copolymers used in the photosensitive compositions of Examples 5 to 10 and Comparative Examples 11 and 12 were evaluated according to the same test methods as in Examples 1 to 3 and Comparative Examples 1 to 10.

As appreciated from Table 2, the use of the copolymers (I) of Examples 5 to 10 according to this invention enables the production of photosensitive compositions excellent in transparency and processability.

In contrast, the copolymer of Comparative Example 11 containing no polyfunctional alkenyl compound is poor in processability and the copolymer of Comparative Example 12 containing a polyfunctional alkenyl compound in too large an amount is poor in solubility in aqueous alkali solutions and accordingly poor in alkali developability.

The photosensitive composition of this invention has various advantageous properties such as water resistance, solvent resistance, rubber elasticity, alkali developability, transparency, processability, mechanical characteristics and the like. Hence, it not only provides a resin relief plate for flexographic printing, but can also widely be used as a photosensitive material.

TABLE 1

|  | Example | | | Comparative Example | | | |
|---|---|---|---|---|---|---|---|
|  | 1 | 2 | 3 | 1 | 2 | 3 | 4 |
| Polymer composition (mole %) | | | | | | | |
| Butadiene | 36.2 | — | 40 | 5 | — | 30 | 30 |
| Isoprene | — | 25 | — | — | — | — | — |
| Ethylene glycol dimethacrylate | 0.8 | 1 | — | 1 | — | 1 | 1 |
| Divinylbenzene | — | — | 3 | — | 9 | — | — |
| Dicyclopentenyl acrylate | 2 | — | 3 | 2 | 5 | 2 | 2 |
| Ethylidenenorbornene | — | 4 | — | — | — | — | — |
| Acrylic acid | — | 25 | — | — | — | — | — |
| Methacrylic acid | 17 | — | 20 | 20 | 45 | 4 | 55 |
| Ethyl acrylate | 44 | 20 | 34 | 52 | 41 | 50 | — |
| Butyl acrylate | — | 25 | — | 20 | — | 13 | 12 |
| Polymer viscosity, [η] (as measured as 30° C. in dimethylformamide) (dl/g) | 0.31 | 0.35 | 0.43 | 0.29 | 0.30 | 0.59 | 0.41 |
| Test results | | | | | | | |
| (1) Solubility in aqueous Alkali solution (insoluble matter %) | 5 | 4 | 10 | 3 | 2 | 58 | 1 |
| (2) Rubber elasticity | ⊙ | ⊙ | ⊙ | Δ | X | ⊙ | Δ |
| (3) Transparency (%) | 65 | 61 | 58 | 68 | 70 | 65 | 63 |
| (4) Water resistance (swelling, %) | 2 | 5 | 1 | 4 | 6 | 1 | 10 |
| (5) Processability | ○ | ○ | ○ | ○ | ○ | ○ | ○ |

|  | Comparative Example | | | | | |
|---|---|---|---|---|---|---|
|  | 5 | 6 | 7 | 8 | 9 | 10 |
| Polymer composition (mole %) | | | | | | |
| Butadiene | 30 | 30 | 30 | 30 | 30 | 65 |
| Isoprene | — | — | — | — | — | — |
| Ethylene glycol dimethacrylate | 0.05 | 25 | 1 | 1 | 1 | 1 |
| Divinylbenzene | — | — | — | — | — | — |
| Dicyclopentenyl acrylate | 2.05 | 2 | 15 | 2 | 2 | 2 |
| Ethylidenenorbornene | — | — | — | — | — | — |
| Acrylic acid | — | — | — | — | — | — |
| Methacrylic acid | 20.9 | 20 | 20 | 20 | 20 | 20 |
| Ethyl acrylate | 47 | 23 | 34 | 20 | 20 | 13 |
| Butyl acrylate | — | — | — | 27 | 27 | — |
| Polymer viscosity, [η] (as measured as 30° C. in dimethylformamide) (dl/g) | 0.38 | 0.45 | 0.39 | 3.1 | 0.005 | 0.35 |

TABLE 1-continued

| Test results | | | | | | |
|---|---|---|---|---|---|---|
| (1) Solubility in aqueous Alkali solution (insoluble matter %) | 1 | 70 | 43 | 10 | 0 | 15 |
| (2) Rubber elasticity | ⊙ | Δ | ⊙ | ⊙ | ⊙ | ⊙ |
| (3) Transparency (%) | 8 | 70 | 62 | 52 | 55 | 45 |
| (4) Water resistance (swelling, %) | 6 | 1 | 2 | 1 | 8 | 1 |
| (5) Processability | X | ○ | ○ | X | X | X |

TABLE 2

| | Example | | | | | | Comparative Example | |
|---|---|---|---|---|---|---|---|---|
| | 5 | 6 | 7 | 8 | 9 | 10 | 11 | 12 |
| Copolymer composition (mole %) | | | | | | | | |
| Butadiene | 38 | 38 | 30 | 15 | 38 | 38 | 38 | 38 |
| Methacrylic acid | 12 | 12 | 30 | 8 | 12 | 12 | 12 | 12 |
| Divinylbenzene | — | 15 | — | — | — | — | — | — |
| Ethylene glycol dimethacrylate | 0.8 | — | 0.2 | 1 | 0.8 | 0.8 | — | 25 |
| Ethylidenenorbornene | — | — | — | — | 10 | — | — | — |
| Dicyclopentadiene | — | — | — | — | — | 10 | — | — |
| Ethyl acrylate | 49.2 | 35 | — | 76 | 39.2 | 39.2 | 50 | 25 |
| Butyl acrylate | — | — | 39.8 | — | — | — | — | — |
| Test results | | | | | | | | |
| (1) Solubility in aqueous alkali solution (insoluble, %) | 5 | 10 | 2 | 6 | 5 | 4 | 1 | 61 |
| (2) Rubber elasticity | ⊙ | ⊙ | ○ | ○ | ⊙ | ⊙ | ⊙ | ○ |
| (3) Transparency (%) | 66 | 70 | 58 | 67 | 65 | 68 | 10 | 69 |
| (4) Water resistance (swelling, %) | 5 | 4 | 6 | 2 | 2 | 2 | 4 | 3 |
| (5) Processability | ○ | ○ | ○ | ○ | ○ | ○ | X | ○ |

What is claimed is:

1. A photosensitive composition, comprising a random copolymer (I), a photopolymerizable unsaturated monomer (ii), and a photosensitizer (III);
   wherein said random copolymer (I) is a conjugated diene random copolymer comprising:
   (A) 10–60 mole % of a conjugated diene compound unit;
   (B) 5–50 mole % of an α,β-ethylenically unsaturated carboxylic acid unit;
   (C) 0.1–20 mole % of a non-conjugated polyfunctional alkenyl compound unit which is ($C_1$) ethylene glycol dimethacrylate, ethylene glycol diacrylate, trimethylolpropane trimethacrylate, propylene glycol dimethacrylate, or propylene glycol diacrylate, ($C_2$) divinylbenzene or ($C_3$) a trivinylbenzene;
   (D) 0–10 mole % of a non-conjugated diene compound unit having cyclic carbon-carbon double bonds; and
   (E) 0–80 mole % of a monoolefinically unsaturated compound unit other than one from (B) above, wherein the sum of the amount of (A), (B), (C), (D) and (E) is 100 mole %, and said random copolymer has an intrinsic viscosity of 0.01 to 3.0 dl g$^{-1}$ as measured at 30° C. in dimethylformamide.

2. A composition according to claim 1, wherein the proportion of the photopolymerizable unsaturated monomer (II) is 5 to 200 parts by weight per 100 parts by weight of the copolymer (I).

3. A composition according to claim 1, wherein the proportion of the photopolymerizable unsaturated monomer (II) is 10 to 100 parts by weight per 100 parts by weight of the copolymer (I).

4. A composition according to claim 1, wherein the photopolymerizable unsaturated monomer (II) is an unsaturated aromatic compound, an unsaturated nitrile compound, an alkyl acrylate or methacrylate, a hydroxyalkyl acrylate or methacrylate, an alkoxyalkylene glycol acrylate or methacrylate, an α,β-ethylenically unsaturated carboxylic acid, a monoester of an unsaturated polycarboxylic acid, a diester, an acrylamide, a methacrylamide, ethylene glycol diacrylate or dimethacrylate, polyalkylene glycol diacrylate or dimethacrylate, or polyalcohol diacrylate, triacrylate, tetraacrylate, dimethacrylate, trimethacrylate, tetramethacrylate or oligoacrylate.

5. A composition according to claim 4, wherein the unsaturated aromatic compound is selected from styrene, α-methylstyrene, m-methylstyrene, p-methylstyrene, p-methoxystyrene, diisopropenylbenzene and divinylbenzene; the unsaturated nitrile is selected from acrylonitrile and methacrylonitrile; the alkyl acrylate or methacrylate is selected from methyl (meth)acrylate, ethyl (meth)-acrylate, propyl (meth)acrylate, n-butyl (meth)acrylate, isopropyl (meth)acrylate, tert-butyl (meth)acrylate, n-pentyl (meth)acrylate, n-hexyl (meth)acrylate, 2-ethylhexyl (meth)acrylate, n-octyl (meth)acrylate, n-decyl (meth)acrylate and lauryl (meth)acrylate; the hydroxyalkyl acrylate or methacrylate is selected from 2-hydroxyethyl acrylate and methacrylate and 2-hydroxypropyl acrylate and methacrylate; the alkoxyalkylene glycol acrylate or methacrylate is selected from methoxyethylene glycol acrylate and methacrylate, and methoxypropylene glycol acrylate and methacrylate; the α,β-ethylenically unsaturated carboxylic acid is selected from maleic acid, fumaric acid, maleic anhydride, crotonic acid, itaconic acid, itaconic anhydride, citraconic acid and mesaconic acid; the monoester of an unsaturated polycarboxylic acid is selected from monoethyl maleate, monoethyl fumarate and monoethyl itaconate; the diester is selected from dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate and dioctyl itaconate; and the acrylamide or the methacrylamide is selected from acrylamide, methacrylamide, N,N′-methylenebisacrylamide and N,N′-hexamethylenebisacrylamide.

6. A composition according to claim 1, wherein the proportion of the photosensitizer (III) is 0.1 to 10 parts by weight per 100 parts by weight of the copolymer (I).

7. A composition according to claim 1, wherein the proportion of the photosensitizer (III) is 1 to 5 parts by weight per 100 parts by weight of the copolymer (I).

8. A composition according to claim 1, wherein the photosensitizer (III) is a diketone compound, an acyloin compound, an acyloin ether or a polynuclear quinone.

9. A composition according to claim 1, wherein the photosensitizer (III) is diacetyl, benzil, benzoin, pivaloin, benzoin methyl ether, benzoin propyl ether, anthraquinone or 1,4-naphthoquinone.

10. The photosensitive composition of claim 1, wherein the conjugated diene compound unit (A) is a 1,3-butadiene unit, an isoprene unit, a chloroprene unit or a 1,3-pentadiene unit.

11. The photosensitive composition of claim 1, wherein the proportion of the conjugated diene compound unit (A) is 15 to 40 mole %.

12. The photosensitive composition of claim 1, wherein the proportion of the conjugated diene compound unit (A) is 20 to 40 %.

13. The photosensitive composition of claim 1, wherein the $\alpha,\beta$-ethylenically unsaturated carboxylic acid unit (B) is an acrylic acid unit, a methacrylic acid unit, a maleic acid unit, a fumaric acid unit, a monoethyl maleate unit or an itaconic acid unit.

14. The photosensitive composition of claim 1, wherein the proportion of the $\alpha,\beta$-ethylenically unsaturated carboxylic acid unit (B) is 5 to 30 mole %.

15. The photosensitive composition of claim 1, wherein the proportion of the $\alpha,\beta$-ethylenically unsaturated carboxylic acid unit (B) is 10 to 20 mole %.

16. The photosensitive composition of claim 1, wherein the proportion of the polyfunctional alkenyl compound unit (C) is 0.1 to 10 mole %.

17. The photosensitive composition of claim 1, wherein the proportion of the polyfunctional alkenyl compound unit (C) is 0.1 to 5 mole %.

18. The photosensitive composition of claim 1, wherein the diene compound unit (D) having cyclic carbon-carbon double bonds is a unit of dicyclopentyl acrylate, dicylcopentenyl methacrylate, dicyclopenteneoxyethyl acrylate, dicyclopentadiene, ethylidenenorbornene or vinylnorbornene.

19. The photosensitive composition of claim 1, wherein the diene compound unit (D) is a unit of dicyclopentenyl acrylate or dicyclopentenoxyethyl acrylate.

20. The photosensitive composition of claim 1, wherein the proportion of the diene compound unit (D) is 0.5 to 10 mole %.

21. The photosensitive composition of claim 1, wherein the proportion of the diene compound unit (D) is 1 to 5 mole %.

22. The photosensitive composition of claim 1, wherein the monoolefinically unsaturated compound unit (E) is a unit of at least one member selected from the group consisting of esters of acrylic and methacrylic acids, styrene, acrylonitrile and vinyl chloride.

23. The photosensitive composition of claim 2, wherein the esters of acrylic and methacrylic acids are selected from ethyl acrylate and methacrylate, n-butyl acrylate and methacrylate, $\alpha$-ethylhexyl acrylate and methacrylate, n-octyl acrylate and methacrylate, dodecyl acrylate and methacrylate, methoxyethyl acrylate and methacrylate, ethoxyethyl acrylate and methacrylate, butoxyethyl acrylate and methacrylate, cyanoethyl acrylate and methacrylate, hydroxyethyl acrylate and methacrylate, and hydroxypropyl acrylate and methacrylate.

24. The photosensitive composition of claim 1, wherein the proportion of the monoolefinically unsaturated compound unit (E) is 20 to 60 mole %.

25. The photosensitive composition of claim 1, wherein the proportion of the monoolefinically unsaturated compound unit (E) is 30 to 50 mole %.

26. The photosensitive composition of claim 1, wherein said conjugated diene random copolymer comprises 38 mole % of butadiene, 12 mole % of methacrylic acid, 0.8 mole % of ethyleneglycol dimethacrylate, and 49.2 mole % of ethylacrylate.

* * * * *